United States Patent [19]

Tachikawa et al.

[11] 4,321,749
[45] Mar. 30, 1982

[54] METHOD FOR PRODUCING SUPERCONDUCTORS

[75] Inventors: Kyoji Tachikawa; Kiyoshi Inoue, both of Tokyo; Kazumasa Togano, Yokohama, all of Japan

[73] Assignee: National Research Institute for Metals, Tokyo, Japan

[21] Appl. No.: 90,573

[22] Filed: Nov. 2, 1979

Related U.S. Application Data

[63] Continuation of Ser. No. 884,815, Mar. 9, 1978, abandoned.

[30] Foreign Application Priority Data

May 2, 1977 [JP] Japan ................................. 52-49005

[51] Int. Cl.³ ............................................ H01L 39/24
[52] U.S. Cl. ..................................... 29/599; 148/133; 148/11.5 F; 148/11.5 Q; 174/126 S
[58] Field of Search .......... 29/599; 174/128 S, 126 S; 148/133, 129, 120, 122, 125, 128, 11.5 Q, 11.5 F

[56] References Cited

U.S. PATENT DOCUMENTS 4,094,059 6/1978 Tachikawa et al. ................. 29/599

FOREIGN PATENT DOCUMENTS 2403665 9/1974 Fed. Rep. of Germany .
2541689 4/1976 Fed. Rep. of Germany ........ 29/599
2623047 11/1977 Fed. Rep. of Germany ... 174/126 S
1380809 10/1964 France ............................ 174/126 S

OTHER PUBLICATIONS

T. Asada et al., Japanese Journal of Applied Physics, 8 (1969) p. 958.
G. Otto, Z. Physik, 218, (1969), pp. 52-55.
H. L. Luo et al., Z. Physik, 230, pp. 443-448.

*Primary Examiner*—Francis S. Husar
*Assistant Examiner*—V. K. Rising
*Attorney, Agent, or Firm*—Fitzpatrick, Cella, Harper & Scinto

[57] ABSTRACT

A method for producing a $V_3Al$ superconductor which comprises making a composite composed of a sheath portion of a copper alloy containing 1 to 15 atomic percent of germanium, 1 to 15 atomic percent of silicon or 2 to 25 atomic percent of gallium and surrounded by the sheath portion, at least one core portion of a vanadium-aluminum alloy containing 0.5 to 20 atomic percent of aluminum; elongating the composite; and then heat-treating the elongated composite thereby to form a $V_3(Al, Ge)$, $V_3(Al, Si)$ or $V_3(Al, Ga)$ layer between the sheath portion and the core portion.

14 Claims, 8 Drawing Figures

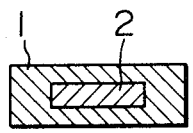
Fig. 1-a
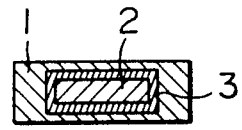
Fig. 1-b
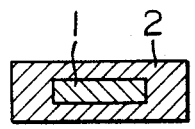
Fig. 2-a
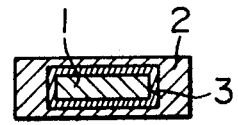
Fig. 2-b
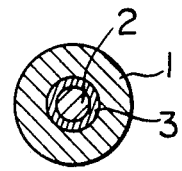
Fig. 3
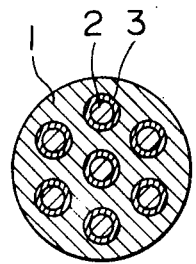
Fig. 4
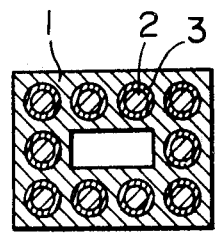
Fig. 5

METHOD FOR PRODUCING SUPERCONDUCTORS

This is a continuation of application Ser. No. 884,815, filed Mar. 9, 1978, now abandoned.

This invention relates to a superconductor, specifically a superconductor including $V_3Al$, and a method for producing the superconductor.

Most superconductors now in use are as magnet wires capable of generating an intensive DC magnetic field without consuming an electric power. Among the superconductors, Nb-Ti wires are now used in the greatest quantity. These Nb-Ti wires, however, can generate a magnetic field of at most 80 kOe, and it has been desired to develop superconductors which can generate a magnetic field of 100 kOe or more. To obtain a high magnetic field, it is necessary to make superconducting materials having a high critical magnetic field Hc. In practical applications, superconducting wires need to exhibit a stable superconducting condition when wound in a magnet form. The stability can be markedly increased by forming wires of the "ultrathin multi-core type" in which very finely divided pieces of a superconductor material are embedded in a normal conductor.

It is known that A-15 type $A_3B$ compounds containing an element A and an element B in a ratio of 3:1 generally have a high superconducting critical temperature Tc and a high superconducting critical magnetic field Hc. $V_3Ga$, $V_3Si$ and $V_3Ge$ are examples of known A-15 type $A_3B$ compounds. $V_3Ga$ and $V_3Si$ are excellent superconductors having a Tc of 15° to 17° K. and an Hc at 4.2° K. of 200 to 220 kOe, and the $V_3Ga$ compound has already gained commercial acceptance. The $V_3Ge$ compound has somewhat low Tc of 6.5° C., but is superconductive.

$V_3Al$ is a kind of the A-15 type $A_3B$ compound, and it is expected to exhibit superconducting characteristics which are equivalent to, or better than, those of $V_3Si$. $V_3Al$, however is an unstable phase, and attempts to synthesize it have failed.

It was reported that by melting vanadium and aluminum together with germanium, silicon or gallium and casting the melt into an ingot, $V_3Al$ can be obtained stably in the form of a pseudo-binary compound such as $V_3(Al, Ge)$, $V_3(Al, Si)$ or $V_3(Al, Ga)$, namely together with $V_3Ge$, $V_3Si$ or $V_3Ga$, and these pseudo-binary compounds are superconducting [G. otto, Z. Physik 218, (1969), P. 52; H. L. Luo et al., Z. Physik, 230, (1970), p. 443; and T. Asada et al., Japan, J. Appl. Phys. 8 (1969), p. 958].

With the method disclosed in these articles, however, it is impossible to produce a $V_3Al$-containing superconducting material in the form of wires that are commercially acceptable.

It is an object of this invention, therefore, to provide a method for producing a pseudo-binary compound $V_3(Al, Ge)$, $V_3(Al, Si)$ or $V_3(Al, Ga)$ in the form of wires.

Another object of this invention is to provide a method for producing a superconducting material in the form of wires which has Tc and Hc values equal to, or higher than, those of $V_3Ga$ or $V_3Si$.

The foregoing objects of the invention are achieved in accordance with this invention by a method for producing a $V_3Al$ superconductor which comprises making a composite composed of a sheath portion of a copper alloy containing 1 to 15 atomic percent of germanium, 1 to 15 atomic percent of silicon, or 2 to 25 atomic percent of gallium and surrounded by the sheath portion, at least one core portion of a vanadium-aluminum alloy containing 0.5 to 20 atomic percent of aluminum; elongating the composite; and then heat-treating the elongated composite thereby to form a $V_3(Al, Ge)$, $V_3(Al, Si)$ or $V_3(Al, Ga)$ layer between the sheath portion and the core portion.

The present inventors have unexpectedly found that when a vanadium-aluminum alloy containing 0.5 to 20 atomic percent of aluminum is heat-treated in contact with a copper-germanium alloy, copper-silicon alloy or copper-gallium alloy, a pseudo-binary compound $V_3(Al, Ge)$, $V_3(Al, Si)$, or $V_3(Al, Ga)$ is formed respectively on the interface between the vanadium alloy and the copper alloy, and these pseudo-binary compounds show excellent superconductivity. It has also been found that a vanadium-aluminum alloy containing up to 20%, of aluminum is easy to fabricate by, for example, extrusion, drawing, or rolling.

The present invention is based on this unexpected discovery.

All of these pseudo-binary compounds have a high Hc, and can be easily formed into ultrafine multi-core wires by the composite-forming method in accordance with this invention. Hence, they have a very high utilitarian value.

The present invention is described hereinbelow in more detail by reference to the accompanying drawings in which:

FIG. 1-a is a sectional view showing one embodiment of a rolled tape-like composite in accordance with this invention;

FIG. 1-b is a sectional view showing a superconductor obtained by heat-treating the composite shown in FIG. 1-a;

FIG. 2-a shows a modified embodiment of a rolled composite having the sheath alloy of FIG. 1-a as a core and the core alloy of FIG. 1-a as a sheath;

FIG. 2-b is a sectional view showing a superconductor obtained by heat-treating the composite shown in FIG. 2-a;

FIG. 3 is a sectional view showing one embodiment of a composite single-core wire of the superconductor of this invention;

FIG. 4 is a sectional view showing one embodiment of a composite multi-core wire of the superconductor of this invention;

FIG. 5 is a sectional view showing one example of a multi-core hollow superconductor in accordance with this invention.

Figure 6:
FIG. 6 is a photomicrographic representation of a section of a superconductive tape produced by the method of this invention.

In FIG. 1-a, the reference numeral 1-a represents a sheath portion composed of a copper alloy containing 1 to 15 atomic percent, preferably 3 to 12 atomic percent, more preferably 5 to 10 atomic percent, of germanium, 1 to 15 atomic percent, preferably 3 to 12 atomic percent, more preferably 5 to 10 atomic percent, of silicon, or 2 to 25 atomic percent, preferably 5 to 21 atomic percent, more preferably 10 to 19 atomic percent, of gallium; and the reference numeral 2 represents a core portion composed of a vanadium-aluminum alloy containing 0.5 to 20 atomic percent, preferably 1 to 20 atomic percent, more preferably 2 to 20 atomic percent, of aluminum. The copper alloy of the sheath portion 1 may further contain up to 15 atomic percent, preferably up to 13 atomic percent, more preferably up to 10 atomic percent, of aluminum. This composite can be produced, for example, by the following procedure.

A matrix of copper alloy containing a predetermined amount of germanium, silicon or gallium, together with aluminum if desired, and a rod of a vanadium-aluminum alloy having a specified composition are prepared. A hole of a size sufficient for the fitting of the vanadium-aluminum alloy rod is formed in the copper alloy matrix. The vanadium-aluminum alloy rod is fitted into the hole to obtain a preformed composite, and the pre-formed composite is hot or cold rolled to elongate it to the desired shape and size. The composite can also be produced by compression-molding the copper alloy and vanadium-aluminum alloy in powder form to give a preformed composite, and then rolling it.

Instead of rolling, the pre-formed composite may be plastically fabricated into the desired shape and size by an elongating method such as tube drawing, extrusion or wire drawing.

When the resulting tape-like composite, as shown in FIG. 1-$a$, is heat-treated, a layer 3 of $V_3Al$ in the form of a pseudo-binary compound with $V_3Ge$, $V_3Si$ or $V_3Ga$ [$V_3(Al, Ge)$, $V_3(Al, Si)$, or $V_3(Al, Ga)$] is formed on the interface between the vanadium alloy 2 and the copper alloy 1.

The heat-treatment temperature is 400° to 1,000° C., preferably 500° to 950° C., more preferably 550° to 900° C., and the heat-treatment time is 5 minutes to 1,000 hours, preferably 15 minutes to 1,000 hours, more preferably 1 hour to 300 hours.

A superconductor of the type shown in FIG. 2-$b$ in which a layer 3 of $V_3(Al, Ge)$, $V_3(Al, Si)$ or $V_3(Al, Ga)$ is formed on the interface between the core and the sheath can also be formed by making a composite of the type shown in FIG. 2-$a$ in the same way as above except that the vanadium-aluminum alloy is used as the sheath and the copper alloy is used as the core.

The quantitative ratio between the core portion and the sheath portion is not critical in particular, but usually, in the cross-section of the elongated material, the cross-sectional area of the core portion accounts for 10 to 50% of the total cross-sectional area of the elongated material.

A wire-like single-core superconductor of the type shown in FIG. 3 can be produced by a similar method to that described hereinabove. A multi-core wire superconductor of the type shown in FIG. 4 can be produced by using a composite in which a plurality of cores are embedded in a sheath alloy. furthermore, a multi-core hollow superconductor of the type shown in FIG. 5 can be produced by embedding a plurality of cores in a hollow sheath.

In any of these modified embodiments, the layer 3 of the pseudo-binary compound $V_3(Al, Ge)$, $V_3(Al, Si)$, or $V_3(Al, Ga)$ is formed on the interface between the core portion and the sheath portion.

FIG. 6 is a microphotograph (1,000 X) of a superconductor obtained by heat-treating at 850° C. for 50 hours a composite tape produced from an alloy of V and 8 atomic percent of Al and an alloy of Cu and 9 atomic percent of Ge.

In FIG. 6, the reference numeral 1 represents the Cu-9 atomic percent Ge alloy; 2, the V-8 atomic percent Al alloy; and 3, a layer of $V_3(Al, Ge)$.

The composite materials prepared as above exhibit excellent superconductivity because of the action of the $V_3(Al, Ge)$, $V_3(Al, Si)$ or $V_3(Al, Ga)$ layer formed on the interface between the core portion and the sheath portion. Formation of the $V_3Al$-containing binary compound is due presumably to the diffusion of Ge, Si or Ga in the Cu alloy and Al in the V-Al compound into the V-Al alloy near the interface between the core portion and the sheath portion as a result of heat-treatment, and the subsequent reaction of such a metal with V.

Cu in the copper alloy used in this invention serves to render Ge, Si and Ga easy to fabricate, and although Cu itself does not diffuse, it has an effect of promoting the diffusion and reaction of Ge, Si or Ga. Al in the V-Al alloy diffuses into the pseudo-binary compound layer which has been formed, or is being formed, by heat-treatment. In other words, the V-Al alloy acts as a source of Al.

The Cu-Ge alloy, Cu-Si alloy and Cu-Ga alloy, optionally together with Al, and the V-Al alloy should be easy to fabricate while cold or hot. The V-Al alloy has a broad range of constituent proportions that form a solid solution. A solid solution of the V-Al alloy is easy to fabricate when it contains not more than 20 atomic percent of Al, but its fabricability is reduced when it contains more than 20 atomic percent of Al. On the other hand, when the Al concentration of the V-Al alloy is less than 0.5 atomic percent, it does not serve as a source of supplying Al to a compound layer in the diffusion and reaction. The Cu-Ge or Cu-Ge-Al alloy is easy to fabricate when it contains not more than 15 atomic percent of Ge or Al, but its fabricability is reduced when it contains more Ge or Al. If the Cu-Ge or Cu-Ge-Al alloy has a Ge concentration of less than 1 atomic percent, a diffused layer having excellent superconducting characteristics does not form. The Cu-Si or Cu-Si-Al alloy is easy to fabricate when it contains not more than 15 atomic percent of Si or Al, but its fabricability is reduced when it contains more Si or Al. If the Cu-Si or Cu-Si-Al alloy contains less than 1 atomic percent of Si, a diffused layer having excellent superconducting characteristics does not form. The Cu-Ga or Cu-Ga-Al alloy is easy to fabricate when it contains not more than 25 atomic percent of Ga, or not more than 25 atomic percent of Ga and not more than 15 atomic percent of Al, but its fabricability is reduced when it contains more Ga or Al. If the Ga concentration is less than 2 atomic percent, a diffused layer having excellent superconducting characteristics does not form.

When the heat-treatment temperature for the diffusion and reaction is lower than 400° C., the diffusion and reaction do not proceed well. Heat-treatment at more than 1,000° C. is not desirable since it will result in the melting of the Cu alloy, or coarsen the crystal grains of the resulting compound layer to cause a decrease in the critical current value.

Composite superconductors including $V_3(Al, Ge)$, $V_3(Al, Si)$ and $V_3(Al, Ga)$ compounds which are produced by the method of this invention all have a high Hc.

To stabilize the superconducting condition, the composite superconductors of this invention may be incorporated with metals having good conductivity, such as Cu or Al, and covered with a metal which becomes a barrier to the diffusion and reaction, such as Nb or Ta. Preferably, the conductive metal covered with the barrier metal is incorporated into a preformed composite before elongation.

The superconductivity of the superconductor of the present invention can also be stabilized by covering it with one or more well conducting metals such as Cu or Al. The covering may be done on the preformed composite before the elongation treatment, or on the finished composite superconductor.

The present invention has made it possible to produce superconductors including $V_3(Al, Ga)$, $V_3(Al, Si)$, and $V_3(Al, Ge)$ which are compounds having a high critical magnetic field. These superconductors are useful as materials for superconducting magnets. According to the method of this invention, ultrafine multi-core wires of a stabilized superconducting condition which have a high utilitarian value can be obtained.

EXAMPLE 1

A rod-like ingot of a V-8 atomic percent Al alloy was produced by arc melting, and fabricated into a round rod having a diameter of 5 mm by rolling with grooved rolls and by swaging. A rod-like ingot of a Cu-9 atomic percent Ge was produced by melting in a Tarmann furnace, and fabricated into a round rod having a diameter of 12.5 mm by rolling with grooved rolls and by swaging. A hole with a diameter of 5.1 mm was provided in the round rod to form a pipe. The rod of the V-8 atomic percent Al rod was fitted into the pipe of the Cu-9 atomic percent Ge, and the composite was cold rolled into a composite tape with a thickness of 0.15 mm and a width of 5 mm by grooved rolls and flat rolls. During the cold rolling, the composite was annealed in vacuo at 600° C. for 1 hour, and this heat-treatment intermediate annealing was repeated several times. The resulting composite tape was enclosed in a quartz tube whose inside was maintained in an argon atmosphere, and heat-treated at 850° C. for 50 hours in it. As shown in FIG. 6, in the heat-treated tape, a $V_3(Al, Ge)$ layer 3 was formed by diffusion in the boundary between a V-8 atomic percent Al alloy core 1 and a Cu-9 atomic percent Ge alloy 2. The tape had a Tc, measured by a four-probe resistance method, of 10.5° K., and an Hc at 4.2° K. of 170 kOe. These measured values indicate that the tape obtained has superior characteristics for use as a practical superconductor.

EXAMPLE 2

In the same way as in Example 1, a composite tape was produced from a V-8 atomic percent Al alloy and a Cu-7 atomic percent Ge-4 atomic percent Al, and heat-treated at 850° C. for 50 hours to perform diffusion. The resulting tape had a Tc of 11.0° K. ahd an Hc at 4.2° K. of 200 kOe.

EXAMPLE 3

A composite tape was produced from A V-3 atomic percent Al alloy and a Cu-9 atomic percent Si alloy in the same way as in Example 1, and heat-treated at 900° C. for 50 hours. Observation by an optical microscope showed that in the resulting composite tape, a $V_3(Al, Si)$ layer formed in the boundary between the V-3 atomic percent Al alloy and the Cu-9 atomic percent Si alloy as a result of diffusion and reaction. The tape had a Tc of 16.2° K. and an Hc at 4.2° K. of 240 kOe, showing very good characteristics for use as a practical superconductor.

EXAMPLE 4

In the same way as in Example 1, a composite tape was produced from a V-3 atomic percent Al alloy and a Cu-8 atomic percent Si-2 atomic percent Al alloy, and heat-treated at 900° C. for 50 hours. The resulting composite tape had a Tc of 160° K., and an Hc at 4.2° K. of 235 kOe.

EXAMPLE 5

In the same way as in Example 1, a composite tape was produced from a V-5 atomic percent Al alloy and a Cu-18 atomic percent Ga alloy, and heat-treated at 650° C. for 50 hours. Observation by an optical microscope showed that in the resulting composite tape, a $V_3(Al, Ga)$ layer formed in the boundary between the V-5 atomic percent Al alloy and the Cu-18 atomic percent Ga alloy. The resulting composite tape had a Tc or 14.4° K. and an Hc at 4.2° K. of 270 kOe, showing very good characteristics for use as a practical superconductor.

EXAMPLE 6

In the same way as in Example 1, a composite tape was produced from a V-5 atomic percent Al alloy and a Cu-17 atomic percent Ga-2 atomic percent Al, and heat-treated at 650° C. for 50 hours. The resulting composite tape had a Tc of 14.5° K. and at Hc at 4.2° K. of 280 kOe.

EXAMPLE 7

In the same way as in Example 1, a composite tape was produced from a V-2 atomic percent Al alloy and a Cu-18 atomic percent Ga, and heat-treated at 650° C. and 50 hours. The resulting composite tape had a Tc of 14.5° K. and an Hc at 4.2° K. of 270 kOe.

EXAMPLE 8

In the same way as in Example 1, a composite tape was produced from a V-2 atomic percent Al alloy and a Cu-18 atomic percent Ga-1 atomic percent Al, and heat-treated at 650° C. for 50 hours. The resulting composite tape had a Tc of 14.4° K. and an Hc at 4.2° K. of 265 kOe.

What we claim is:
1. A method for producing a $V_3Al$ superconductor which comprises
    (1) making a composite composed of a sheath portion surrounding at least one core portion, said sheath portion being composed of an alloy of copper with a member selected from the group consisting of 1 to 15 atomic percent of silicon and 2 to 25 atomic percent of gallium and said core portion being composed of a vanadium-aluminum alloy containing 0.5 to 5 atomic percent of aluminum;
    (2) elongating the composite; and
    (3) then heat-treating the elongated composite to form a superconductor layer which is between the sheath portion and the core portion and which is composed of a superconductive pseudo-binary compound selected from the group consisting of $V_3(Al, Si)$ and $V_3(Al, Ga)$.
2. The method of claim 1 wherein the copper alloy in the sheath portion further contains up to 15 atomic percent of aluminum.
3. The method of claim 1 wherein the heat-treatment is carried out at a temperature of 400° to 1,000° C.
4. The method of claim 3 wherein the heat-treatment is carried out for 5 minutes to 1,000 hours.
5. The method of claim 1 wherein said sheath portion is composed of an alloy of copper with a member selected from the group consisting of 3 to 12 atomic percent of silicon and 5 to 21 atomic percent of gallium.

6. The method of claim 2 wherein said copper alloy further contains up to 13 atomic percent of aluminum.

7. The method of claim 1 wherein the core portion of the elongated composite has a cross-sectional area equal to 10 to 50 percent of the total cross-sectional area of the elongated composite.

8. A method for producing a $V_3Al$ superconductor which comprises
   (1) making a composite composed of a sheath portion surrounding at least one core portion, said core portion being composed of an alloy of copper with a member selected from the group consisting of 1 to 15 atomic percent of silicon and 2 to 25 atomic percent of gallium and said sheath portion being composed of a vanadium-aluminum alloy containing 0.5 to 5 atomic percent of aluminum;
   (2) elongating the composite, and
   (3) then heat-treating the elongated composite to form a superconductor layer which is between the sheath portion and the core portion and which is composed of a superconductive pseudo-binary compound selected from the group consisting of $V_3(Al, Si)$ and $V_3(Al, Ga)$.

9. The method of claim 8 wherein the copper alloy in the core portion further contains up to 15 atomic percent of aluminum.

10. The method of claim 8 wherein the heat-treatment is carried out at a temperature of 400° to 1,000° C.

11. The method of claim 10 wherein the heat-treatment is carried out for 5 minutes to 1,000 hours.

12. The method of claim 8 wherein said core portion is composed of an alloy of copper with a member selected from the group consisting of 3 to 12 atomic percent of silicon and 5 to 21 atomic percent of gallium.

13. The method of claim 9 wherein said copper alloy further contains up to 13 atomic percent of aluminum.

14. The method of claim 8 wherein the core portion of the elongated composite has a cross-sectional area equal to 10 to 50 percent of the total cross-sectional area of the elongated composite.

* * * * *

UNITED STATES PATENT AND TRADEMARK OFFICE
CERTIFICATE OF CORRECTION

PATENT NO.   : 4,321,749

DATED        : March 30, 1982

INVENTOR(S)  : Kyoji Tachikawa, et al

It is certified that error appears in the above-identified patent and that said Letters Patent is hereby corrected as shown below:

The Title page should be deleted to appear as per attached Title page:

Signed and Sealed this

Tenth Day of August 1982

[SEAL]

Attest:

GERALD J. MOSSINGHOFF

Attesting Officer   Commissioner of Patents and Trademarks

United States Patent [19]

Tachikawa et al.

[11] 4,321,749
[45] Mar. 30, 1982

[54] METHOD FOR PRODUCING SUPERCONDUCTORS

[75] Inventors: Kyoji Tachikawa; Kiyoshi Inoue, both of Tokyo; Kazumasa Togano, Yokohama, all of Japan

[73] Assignee: National Research Institute for Metals, Tokyo, Japan

[21] Appl. No.: 90,573

[22] Filed: Nov. 2, 1979

Related U.S. Application Data

[63] Continuation of Ser. No. 884,815, Mar. 9, 1978, abandoned.

[30] Foreign Application Priority Data

May 2, 1977 [JP] Japan .................. 52-49005

[51] Int. Cl.³ .............................. H01L 39/24
[52] U.S. Cl. ........................... 29/599; 148/133; 148/11.5 F; 148/11.5 Q; 174/126 S
[58] Field of Search .......... 29/599; 174/128 S, 126 S; 148/133, 129, 120, 122, 125, 128, 11.5 Q, 11.5 F

[56] References Cited

U.S. PATENT DOCUMENTS 4,094,059  6/1978  Tachikawa et al. .................. 29/599

FOREIGN PATENT DOCUMENTS 2403665  9/1974  Fed. Rep. of Germany
2541689  4/1976  Fed. Rep. of Germany ........ 29/599
2623047  11/1977 Fed. Rep. of Germany ... 174/126 S
1380809  10/1964 France .......................... 174/126 S

OTHER PUBLICATIONS

T. Asada et al., Japanese Journal of Applied Physics, 8 (1969) p. 958.
G. Otto, Z. Physik, 218, (1969), pp. 52-55.
H. L. Luo et al., Z. Physik, 230, pp. 443-448.

*Primary Examiner*—Francis S. Husar
*Assistant Examiner*—V. K. Rising
*Attorney, Agent, or Firm*—Fitzpatrick, Cella, Harper & Scinto

[57] ABSTRACT

A method for producing a $V_3Al$ superconductor which comprises making a composite composed of a sheath portion of a copper alloy containing 1 to 15 atomic percent of germanium, 1 to 15 atomic percent of silicon or 2 to 25 atomic percent of gallium and surrounded by the sheath portion, at least one core portion of a vanadium-aluminum alloy containing 0.5 to 20 atomic percent of aluminum; elongating the composite; and then heat-treating the elongated composite thereby to form a $V_3(Al, Ge)$, $V_3(Al, Si)$ or $V_3(Al, Ga)$ layer between the sheath portion and the core portion.

14 Claims, 8 Drawing Figures

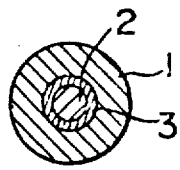

UNITED STATES PATENT AND TRADEMARK OFFICE
CERTIFICATE OF CORRECTION

PATENT NO. : 4,321,749
DATED : March 30, 1982
INVENTOR(S) : Kyoji Tachikawa, et al It is certified that error appears in the above—identified patent and that said Letters Patent is hereby corrected as shown below:

In the cover page, Item [30], correct the number of the Japanese priority application to read "52-49905".

Signed and Sealed this

Twenty-first Day of December 1982

[SEAL]

Attest:

Attesting Officer

GERALD J. MOSSINGHOFF

Commissioner of Patents and Trademarks